(12) United States Patent
Park

(10) Patent No.: US 7,984,621 B2
(45) Date of Patent: Jul. 26, 2011

(54) AIR CONDITIONING SYSTEM FOR COMMUNICATION EQUIPMENT AND CONTROLLING METHOD THEREOF

(75) Inventor: Hee Tae Park, Seoul (KR)

(73) Assignee: Chang Jo 21 Co., Ltd., Gyeonggi-Do (KR)

( * ) Notice: Subject to any disclaimer, the term of this patent is extended or adjusted under 35 U.S.C. 154(b) by 801 days.

(21) Appl. No.: 12/067,045

(22) PCT Filed: Sep. 15, 2006

(86) PCT No.: PCT/KR2006/003685
§ 371 (c)(1),
(2), (4) Date: Mar. 14, 2008

(87) PCT Pub. No.: WO2007/052898
PCT Pub. Date: May 10, 2007

(65) Prior Publication Data
US 2008/0250807 A1    Oct. 16, 2008

(30) Foreign Application Priority Data

Sep. 15, 2005  (KR) .................. 10-2005-0086223
Sep. 15, 2005  (KR) .................. 10-2005-0086231
Sep. 15, 2005  (KR) .................. 10-2005-0086249

(51) Int. Cl.
*F25D 17/00*    (2006.01)
*F25B 7/00*    (2006.01)
(52) U.S. Cl. ................ 62/333; 62/335; 62/185
(58) Field of Classification Search .......... 62/259.2, 62/333, 335, 175, 305, 436, 180, 199, 235.1, 62/236
See application file for complete search history.

(56) References Cited

U.S. PATENT DOCUMENTS

| | | | | |
|---|---|---|---|---|
| 4,406,138 | A * | 9/1983 | Nelson ............................. | 62/305 |
| 5,142,879 | A * | 9/1992 | Nakamura et al. .............. | 62/160 |
| 6,041,613 | A * | 3/2000 | Morse et al. .................... | 62/305 |
| RE36,684 | E * | 5/2000 | Rockenfeller et al. ........ | 62/324.2 |
| 6,131,401 | A * | 10/2000 | Ueno et al. ...................... | 62/175 |
| 6,148,634 | A * | 11/2000 | Sherwood ........................ | 62/434 |
| 6,405,554 | B1 * | 6/2002 | Kawakatu et al. .............. | 62/335 |
| 6,425,250 | B1 * | 7/2002 | Acharya et al. .................... | 62/6 |
| 6,880,351 | B2 * | 4/2005 | Simadiris et al. ............... | 62/185 |

(Continued)

FOREIGN PATENT DOCUMENTS

JP    07091776    4/1995

(Continued)

*Primary Examiner* — Frantz F Jules
*Assistant Examiner* — Cassey Bauer
(74) *Attorney, Agent, or Firm* — Rabin & Berdo, PC

(57) ABSTRACT

An air conditioning system for communication equipment. An indoor module has expansion valves installed on refrigerant pipes, brine coolers each having heat exchange tubes to which the refrigerant pipe extending from each expansion valve and a separate brine pipe are connected, compressors for compressing refrigerant, an indoor heat exchanger having a heat exchange tube to which the brine pipe extending from the brine coolers is connected, and an indoor blower. An outdoor module has circulation pumps connected in parallel to the brine pipe extending from the indoor heat exchanger, outdoor heat exchangers connected in series with each other while facing each other and each having a heat exchange tube to which the brine pipe extending from the circulation pumps is connected, condensers facing each other and having tubes to which the refrigerant pipes extending from the compressors are connected in parallel, and an outdoor blower.

20 Claims, 12 Drawing Sheets

U.S. PATENT DOCUMENTS

| | | | |
|---|---|---|---|
| 6,938,429 B2 * | 9/2005 | Katogi et al. | 62/175 |
| 7,000,416 B2 * | 2/2006 | Hirooka et al. | 62/259.2 |
| 7,270,278 B2 * | 9/2007 | Street et al. | 236/51 |
| 7,793,511 B2 * | 9/2010 | Yoon et al. | 62/208 |
| 2002/0092315 A1 * | 7/2002 | Tanaka et al. | 62/480 |
| 2003/0188543 A1 * | 10/2003 | Trecate | 62/96 |
| 2003/0230100 A1 * | 12/2003 | Hwang, II | 62/184 |
| 2005/0160752 A1 * | 7/2005 | Ghoshal et al. | 62/259.2 |
| 2007/0101750 A1 * | 5/2007 | Pham et al. | 62/332 |
| 2008/0078542 A1 * | 4/2008 | Gering et al. | 165/202 |
| 2009/0019874 A1 * | 1/2009 | Park | 62/259.1 |

FOREIGN PATENT DOCUMENTS

| | | |
|---|---|---|
| JP | 11201563 | 7/1999 |
| KR | 2003-0009820 | 2/2003 |
| KR | 2004-0008302 | 1/2004 |

* cited by examiner

AIR CONDITIONING SYSTEM FOR COMMUNICATION EQUIPMENT AND CONTROLLING METHOD THEREOF

TECHNICAL FIELD

The present invention relates to air conditioning for communication equipment, and more particularly, to an air conditioning system for communication equipment which is arranged in a base station, a booth, etc. to cool communication equipment disposed therein, and is decreased in size to prevent noise generation, overheating and malfunction thereof and to ensure stable operation of the communication equipment, and a controlling method thereof.

BACKGROUND ART

A conventional air conditioning system employs evaporation heat which is absorbed by refrigerant from surroundings when the refrigerant evaporates. As the refrigerant, liquids such as ammonia, Freon, an azeotropic refrigerant mixture, chloromethyl, and so on, are generally used.

In the conventional air conditioning system, as a vaporized refrigerant, which is compressed by a compressor to a high pressure, flows through a condenser, the refrigerant exchanges heat with the outside air, and condenses into a liquid refrigerant having a high pressure. The liquid refrigerant having a high pressure is then converted into a low pressure liquid refrigerant after passing through an expansion valve or a capillary tube.

The low pressure liquid refrigerant enters an evaporator, exchanges heat with the inside air, and evaporates. Thereafter, the evaporated low pressure refrigerant enters the compressor to complete an air conditioning cycle which is continuously repeated. The air cooled by the evaporation heat absorbed by the refrigerant in the evaporator is directed to a space or a target object by a blower fan to conduct a cooling function.

The conventional air conditioner uses refrigerant the phase of which can easily be changed, such as through condensation and evaporation, to cool a desired space or a target object.

Meanwhile, in a base station or a communication car, various wired or wireless communication equipment is installed. The communication equipment is likely to have loose connections or to break down due to the frequent generation of heat, and thus the possibility of malfunction increases. For this reason, it is necessary to cool the communication equipment all year round to ensure reliable operation thereof.

However, in the conventional air conditioning system for communication equipment, since naturally cold outside temperatures are not appropriately taken advantage of and the air conditioning system is driven only by electric power, costs are increased, and electric power is wasted.

In order to overcome these problems, the present applicant has disclosed Korean Patent Application No. 2005-14790, entitled "Air conditioner for communication equipment and controlling method thereof". The air conditioner disclosed in this patent document employs outside air while ensuring that the air-conditioned state of an indoor space can be reliably maintained even when a component part of the air conditioner does not work. Nevertheless, this type of air conditioner encounters a problem in that the size of the outdoor module increases, and therefore, noise is generated.

DISCLOSURE OF INVENTION

Technical Problem

Accordingly, the present invention has been made in an effort to solve the problems occurring in the related art, and an object of the present invention is to provide an air conditioning system for communication equipment in which the size of an outdoor module is decreased and noise generation is reduced, and which appropriately employs naturally cold outside temperatures to minimize electric power consumption, thereby reliably maintaining the communication equipment in a cooled state, and a controlling method thereof.

Technical Solution

In order to achieve the above object, according to one aspect of the present invention, there is provided an air conditioning system for communication equipment, comprising an indoor module placed inside a base station in which communication equipment is installed, the indoor module having expansion valves installed on refrigerant pipes, brine coolers each having a pair of heat exchange tubes to which the refrigerant pipe extending from each expansion valve and a separate brine pipe are respectively connected, compressors for compressing refrigerant having passed through the brine coolers, an indoor heat exchanger having a heat exchange tube to which the brine pipe extending from the brine coolers is connected, and at least one indoor blower located adjacent to the indoor heat exchanger; and an outdoor module placed outside the base station, the outdoor module having a pair of circulation pumps connected in parallel to the brine pipe extending from the indoor heat exchanger, a pair of outdoor heat exchangers connected in series with each other while facing each other and each having a heat exchange tube to which the brine pipe extending from the circulation pumps is connected, a pair of condensers facing each other and having tubes to which the refrigerant pipes extending from the compressors of the indoor module are connected in parallel, and at least one outdoor blower located between the pair of outdoor heat exchangers.

In order to achieve the above object, according to another aspect of the present invention, there is provided an air conditioning system for communication equipment, comprising an indoor module placed inside a base station in which communication equipment is installed, the indoor module having expansion valves installed in refrigerant pipes, brine coolers each having a pair of heat exchange tubes to which the refrigerant pipe extending from each expansion valve and a separate brine pipe are respectively connected, compressors for compressing refrigerant having passed through the brine coolers, an indoor heat exchanger having a heat exchange tube to which the brine pipe extending from the brine coolers is connected, and at least one indoor blower located adjacent to the indoor heat exchanger; and an outdoor module placed outside the base station, the outdoor module having a pair of circulation pumps connected in parallel to the brine pipe extending from the indoor heat exchanger, a pair of outdoor heat exchangers connected in series with each other while facing each other and each having a heat exchange tube to which the brine pipe extending from the circulation pumps is connected, a pair of condensers facing each other and having tubes to which the refrigerant pipes extending from the compressors of the indoor module are connected in series, and at least one outdoor blower located between the pair of outdoor heat exchangers.

In order to achieve the above object, according to another aspect of the present invention, there is provided a method for controlling the air conditioning system comprising a first step of sensing indoor and outdoor temperatures of the base station and a brine temperature using the indoor and outdoor temperature sensors and the brine temperature sensor; a second step of comparing the indoor temperature with a first reference temperature and interrupting the operation of the entire air conditioning system when the indoor temperature is lower than the first reference temperature; a third step of comparing the outdoor temperature and the brine temperature, actuating the outdoor heat exchangers when the outdoor temperature is lower than the brine temperature, and interrupting the operation of the outdoor heat exchangers when the outdoor temperature is equal to or higher than the brine temperature; a fourth step of actuating the first cooling section and the condensers when the indoor temperature is higher than a second reference temperature, and interrupting the operation of the first cooling section and the condensers when the indoor temperature is equal to or lower than the second reference temperature; and a fifth step of actuating the first and second cooling sections and the condensers when the indoor temperature is higher than a third reference temperature, and interrupting operation of the second cooling section when the indoor temperature is equal to or lower than the third reference temperature.

According to another aspect of the present invention, the electromotive louvers are controlled to be opened and closed depending upon the operation of the outdoor heat exchangers and the condensers such that, when the entire cooling group and the condensers operate, the louvers installed adjacent to the outdoor heat exchangers are closed.

According to still another aspect of the present invention, the third step further comprises a third-first step of interrupting the operation of the outdoor blower when the brine temperature is lower than a fourth reference temperature, and actuating the outdoor blower when the brine temperature is equal to or higher than the fourth reference temperature.

According to a still further aspect of the present invention, the third-first step further comprises a third-second step of interrupting the operation of the outdoor blower when the brine temperature is higher than the fourth reference temperature and is lower than a fifth reference temperature, and actuating the outdoor blower when the brine temperature is equal to or higher than the fifth reference temperature.

ADVANTAGEOUS EFFECTS

Thanks to the above features, the air conditioning system for communication equipment and the controlling method thereof according to the present invention, constructed as mentioned above, provide advantages in that the size of an outdoor module is decreased, noise generation is reduced, and naturally cold outside temperatures are employed as appropriate to minimize electric power consumption and increase cooling efficiency. Further, since a brine circulation structure using double cooling sections and double outdoor heat exchange structures is adopted, cooling efficiency and reliability are improved.

BRIEF DESCRIPTION OF THE DRAWINGS

The above objects, and other features and advantages of the present invention will become more apparent after reading the following detailed description in conjunction with the drawings, in which.

DESCRIPTION OF REFERENCE NUMERALS FOR MAIN PARTS OF DRAWINGS

Figure 1:
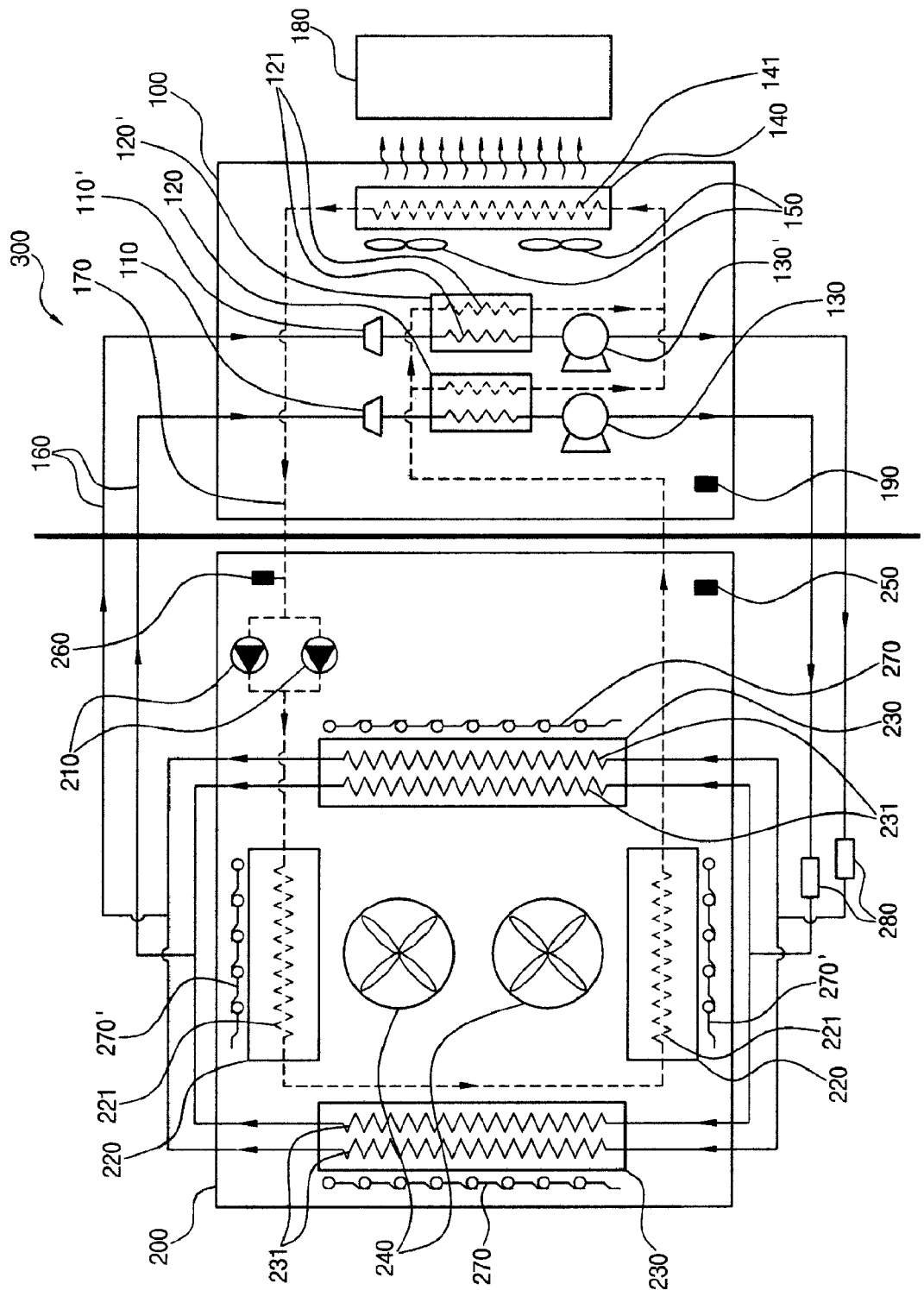
FIG. 1 is a schematic structural view illustrating an air conditioning system for communication equipment in accordance with a first embodiment of the present invention.

100: indoor module 110, 110' expansion valves
120, 120' brine coolers 121: heat exchange tubes
130, 130' compressors 140: indoor heat exchanger
141: heat exchange tube 150: indoor blowers
160: refrigerant pipes 170: brine pipe
171, 172, 173, 174: adjustment valves
180: communication equipment
190: indoor temperature sensor
200: outdoor module
210: circulation pumps 220: outdoor heat exchangers
221: heat exchange tubes 230: condensers
231: heat exchange tubes 240: outdoor blowers
250: outdoor temperature sensor
260: brine temperature sensor
270, 270' louvers 280: receiver driers
300: base station

BEST MODE FOR CARRYING OUT THE INVENTION

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 is a schematic structural view illustrating an air conditioning system for communication equipment in accordance with a first embodiment of the present invention.

Referring to FIG. 1, the air conditioning system for communication equipment in accordance with the first embodiment of the present invention comprises an indoor module 100 which is placed inside a base station 300 and an outdoor module 200 which is placed outside the base station 300.

The indoor module 100 comprises expansion valves 110 and 110' brine coolers 120 and 120' compressors 130 and 130' an indoor heat exchanger 140, and indoor blowers 150.

The expansion valves 110 and 110' are respectively installed in refrigerant pipes 160 which are disposed separately from each other, and abruptly convert the liquid refrigerant supplied through the refrigerant pipes 160 and having a high pressure into misty refrigerant having a low temperature and a low pressure.

The refrigerant used in the present invention is one well known in the art, such as ammonia, Freon, an azeotropic refrigerant mixture, chloromethyl, and so on.

Each of the brine coolers 120 and 120' has a pair of heat exchange tubes 121 to which the refrigerant pipe 160 extending from each of the expansion valves 110 and 110' and a separate brine pipe 170 are respectively connected.

Brine is a solution of $CaCl_2$ and NaCl or liquid that has a low freezing point, and is mainly used in an indirect cooling method.

The compressors 130 and 130' compress the refrigerant having passed through the brine coolers 120 and 120' and comprise conventional compressors for compressing refrigerant to a high pressure.

The expansion valves 110 and 110' the brine coolers 120 and 120' and the compressors 130 and 130' of the indoor module 100 constitute a single cooling group which is divided into first and second cooling sections. The first and second cooling sections are respectively connected to the refrigerant pipes 160 which are separate from each other, and the two brine coolers 120 and 120' are connected in parallel to one brine pipe 170.

Hereinafter, for the sake of convenience in explanation, it is assumed that the expansion valve 110, the brine cooler 120 and the compressor 130 constitute the first cooling section, and the expansion valve 110' the brine cooler 120' and the compressor 130' constitute the second cooling section.

Since brine passes in parallel through the brine coolers 120 and 120' even when one of the brine coolers 120 and 120' does not work, the cooled state of the brine can be reliably maintained.

The indoor heat exchanger 140 has a heat exchange tube 141, and the brine pipe 170 extending from the brine coolers 120 and 120' is connected to the heat exchange tube 141.

The indoor blowers 150 are positioned adjacent to the heat transfer surface of the indoor heat exchanger 140 on which heat transfer occurs, and are structured so that air cooled through the heat exchange function of the indoor heat exchanger 140 can be blown toward communication equipment 180.

The indoor blowers 150 function to increase contact and heat exchange efficiency between the indoor heat exchanger 140 and indoor air.

The outdoor module 200 comprises circulation pumps 210, outdoor heat exchangers 220, condensers 230, and outdoor blowers 240.

A pair of circulation pumps 210 is used and is connected in parallel to the brine pipe 170 extending from the indoor heat exchanger 140. Preferably, regulation valves are respectively installed in the inlet and the outlet of each circulation pump 210 to appropriately regulate the amounts of brine that pass through the inlet and the outlet of each circulation pump 210.

Therefore, in the present invention, due to the fact that double brine circulation structures, in which the pair of circulation pumps 210 are installed in parallel, are adopted, even when one circulation pump 210 does not work, the other circulation pump 210 can properly operate, as a result of which the cooled state of the communication equipment disposed in the base station 300 can be reliably maintained.

The outdoor heat exchangers 220 are located to face each other and are connected in series with each other. Each outdoor heat exchanger 220 has a heat exchange tube 221 to which the brine pipe 170 extending from the circulation pumps 210 is connected.

Therefore, as the outdoor module 200 adopts double structures in which the pair of outdoor heat exchangers 220 is installed in series on the brine pipe 170, heat exchange efficiency can be significantly improved.

The condensers 230 are located adjacent to both ends of the outdoor heat exchangers 220 to face each other. The two condensers 230 are connected in parallel to the refrigerant pipes 160. Each condenser 230 has a pair of tubes 231 to which the refrigerant pipes 160 extending from the compressors 130 and 130' of the indoor module 100 are respectively connected.

The condensers 230 serve as heat exchangers for condensing and liquefying the refrigerant which is supplied from the compressors 130 and 130 and has a high pressure. As described above, the condensers 230 are connected in parallel to the refrigerant pipes 160 and have respective pairs of tubes 231. Therefore, even when one condenser 230 does not work, the stable operation of the other condenser 230 is ensured, and the operational efficiency of the condensers 230 is improved.

Receiver dryers 280 are installed on respective refrigerant pipes 160 which connect the compressors 130 and 130' and the condensers 230 with each other. The receiver dryers 280 temporarily store the refrigerant which is discharged from the compressors 130 and 130' and has a high pressure, and remove moisture, dust, etc. from the refrigerant.

The pair of outdoor blowers 240 is located between the pair of outdoor heat exchangers 220 and between the pair of condensers 230. In particular, the outdoor blowers 240 are positioned adjacent to the heat transfer surfaces of the outdoor heat exchangers 220 at which heat transfer occurs, and function to increase contact and heat exchange efficiency between the outdoor heat exchangers 220 and outdoor air.

In the present invention, the brine coolers 120 and 120' are included in the indoor module 100, the pair of outdoor heat exchangers 220 facing each other and the pair of condensers 230 facing each other are located to define a hollow quadrangular shape, and the outdoor blowers 240 are positioned inside the hollow quadrangular shape. Therefore, since space utilization efficiency is increased, it is possible to miniaturize the outdoor module 200, decrease the number of outdoor blowers 240, and suppress noise generation.

Electromotive louvers 270 and 270' are installed outside and adjacent to the outdoor heat exchangers 220 and the condensers 230. The electromotive louvers 270 and 270' comprise horizontal arrangements of plates having a narrow width and are controlled to be opened and closed depending upon the operations of the outdoor heat exchangers 220 and the condensers 230.

In the meanwhile, in the present invention, in order to effectively control the cooling function, an indoor temperature sensor 190 is installed inside the base station 300, and an outdoor temperature sensor 250 is installed outside the base station 300.

A brine temperature sensor 260 is installed on the portion of the brine pipe 170 that is introduced into the outdoor module 200 after passing through the indoor heat exchanger 140.

The temperatures sensed by the indoor temperature sensor 190, the outdoor temperature sensor 250 and the brine temperature sensor 260 are compared with one another or with reference temperatures, based on which the indoor heat exchanger 140 and the outdoor heat exchangers 220 are selectively driven to cool the space inside the base station 300.

Figure 2:
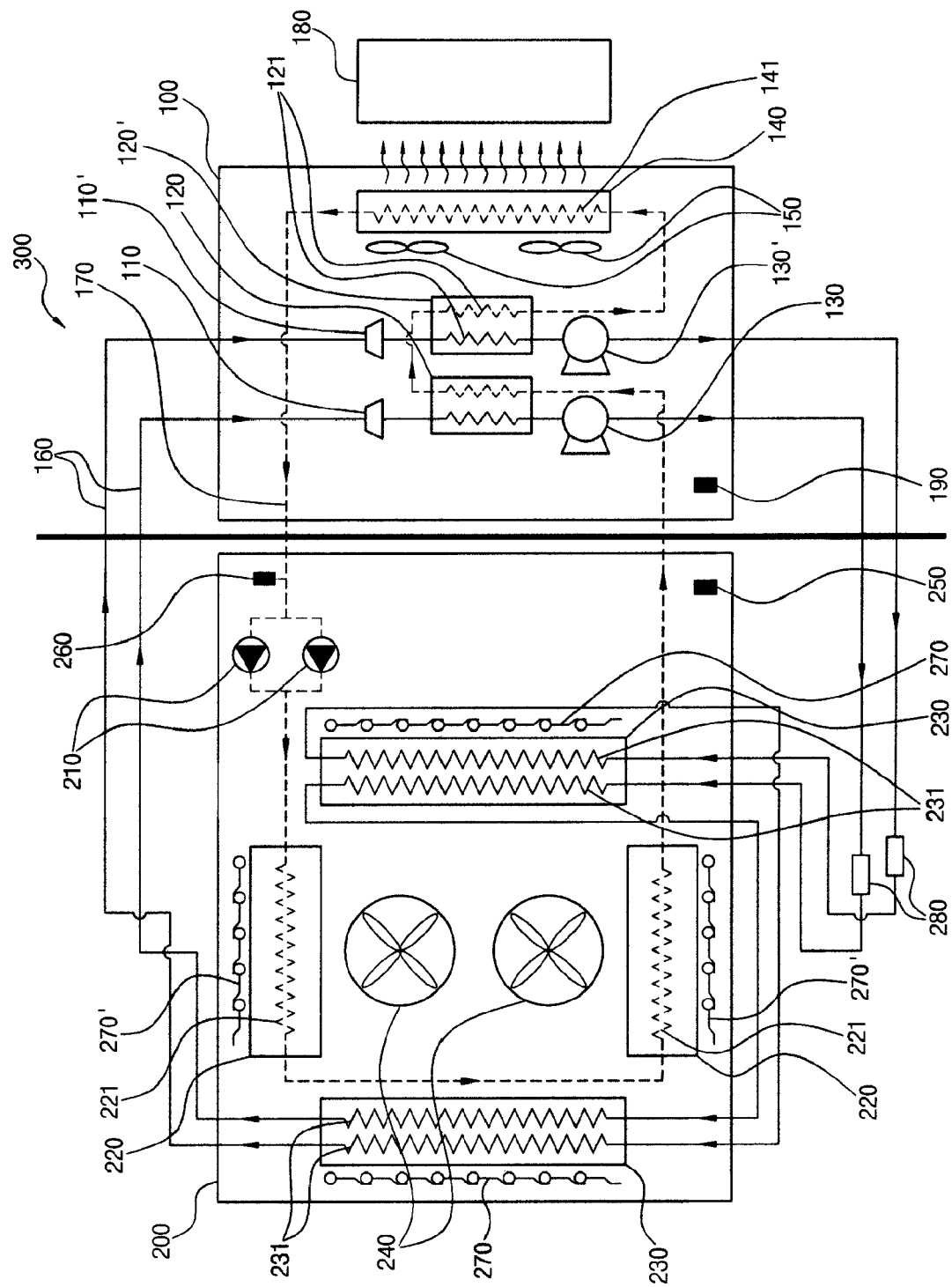
FIG. 2 is a schematic structural view illustrating an air conditioning system for communication equipment in accordance with a second embodiment of the present invention.

FIG. 2 is a schematic structural view illustrating an air conditioning system for communication equipment in accordance with a second embodiment of the present invention.

Referring to FIG. 2, in the air conditioning system for communication equipment in accordance with this second embodiment of the present invention, the expansion valves 110 and 110' the brine coolers 120 and 120' and the compressors 130 and 130' of the indoor module 100 constitute a single cooling group which is divided into first and second cooling sections. The first and second cooling sections are respectively connected to the refrigerant pipes 160 which are separate from each other, and the two brine coolers 120 and 120' are connected in series to one brine pipe 170.

Therefore, because the brine passes twice through the brine coolers 120 and 120' the cooled state of the brine can be appropriately adjusted as desired.

Also, the condensers 230 of the outdoor module 200 are located adjacent to the two ends of the outdoor heat exchangers 220 and face each other. The pair of condensers 230 is connected in series to the refrigerant pipes 160. Each condenser 230 has a pair of tubes 231 to which the refrigerant pipes 160 extending from the compressors 130 and 130' of the indoor module 100 are respectively connected.

In the air conditioning system according to this second embodiment, because the condensers 230 are connected in series to the refrigerant pipes 160 and each condenser 230 has a pair of tubes 231, the cooling efficiency of the refrigerant can be doubled.

Component elements, other than those described above, and their connections are the same as the first embodiment.

Figure 3:
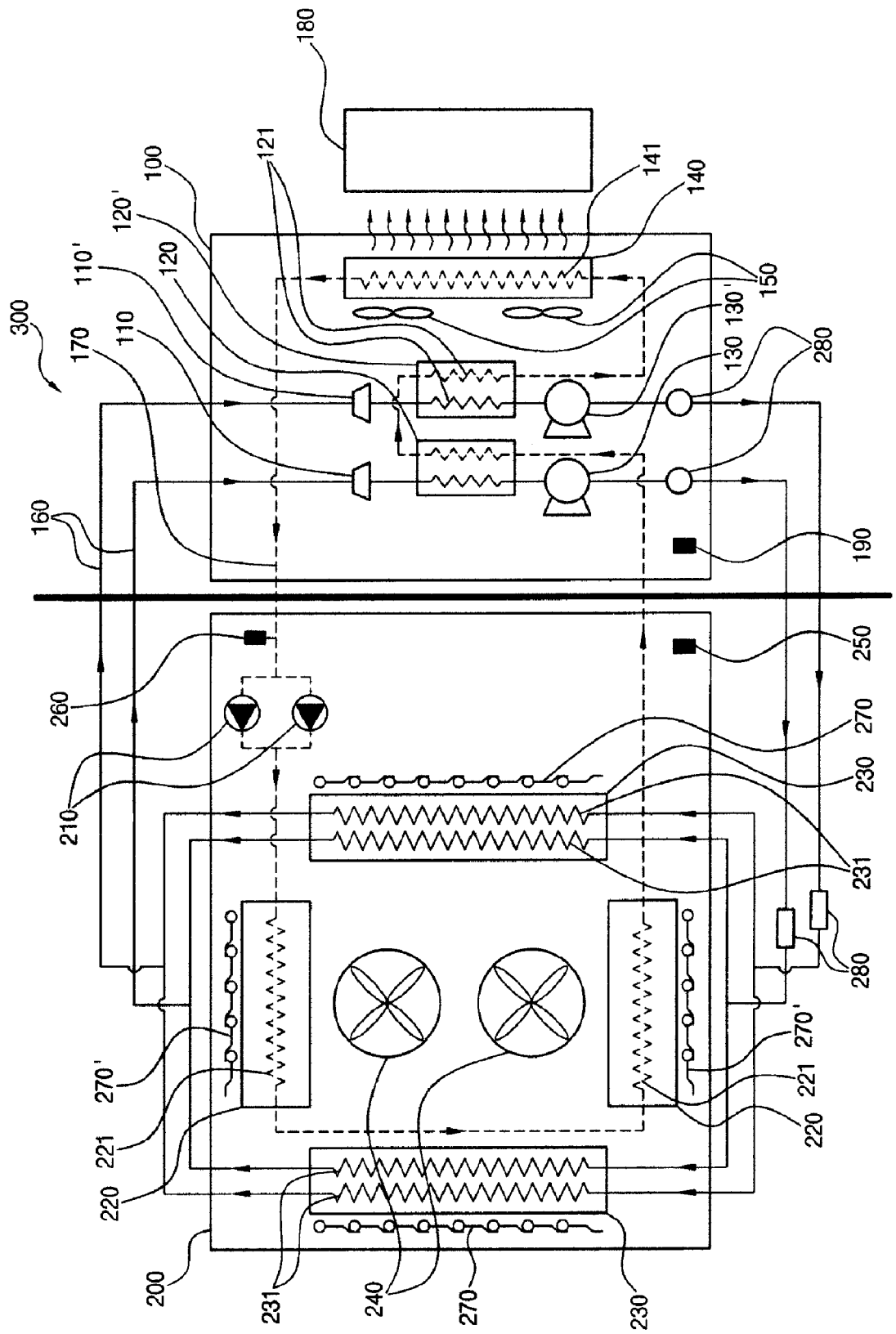
FIG. 3 is a schematic structural view illustrating an air conditioning system for communication equipment in accordance with a third embodiment of the present invention.

FIG. 3 is a schematic structural view illustrating an air conditioning system for communication equipment in accordance with a third embodiment of the present invention.

Referring to FIG. 3, in the air conditioning system for communication equipment in accordance with this third embodiment of the present invention, the expansion valves 110 and 110' the brine coolers 120 and 120' and the compressors 130 and 130' of the indoor module 100 constitute a single cooling group which is divided into first and second cooling sections. The first and second cooling sections are connected to respective refrigerant pipes 160 which are spaced apart from each other, and the two brine coolers 120 and 120' are connected in series to one brine pipe 170.

Therefore, since the brine doubly passes through the brine coolers 120 and 120' the cooled state of the brine can be appropriately adjusted as desired.

Also, the condensers 230 of the outdoor module 200 are located adjacent to both ends of the outdoor heat exchangers 220 and face each other. The pair of condensers 230 is connected in parallel to the refrigerant pipes 160. Each condenser 230 has a pair of tubes 231 to which the refrigerant pipes 160 extending from the compressors 130 and 130' of the indoor module 100 are respectively connected.

In the air conditioning system according to this third embodiment, because the condensers 230 are connected in parallel to the refrigerant pipes 160 and each condenser 230 has the pair of tubes 231, even when one condenser 230 or one tube 231 does not work, the stable operation of the other condenser 230 or the other tube 231 is ensured.

In this third embodiment, component elements other than those described above and their connections are the same as the first or second embodiment.

Figure 4:
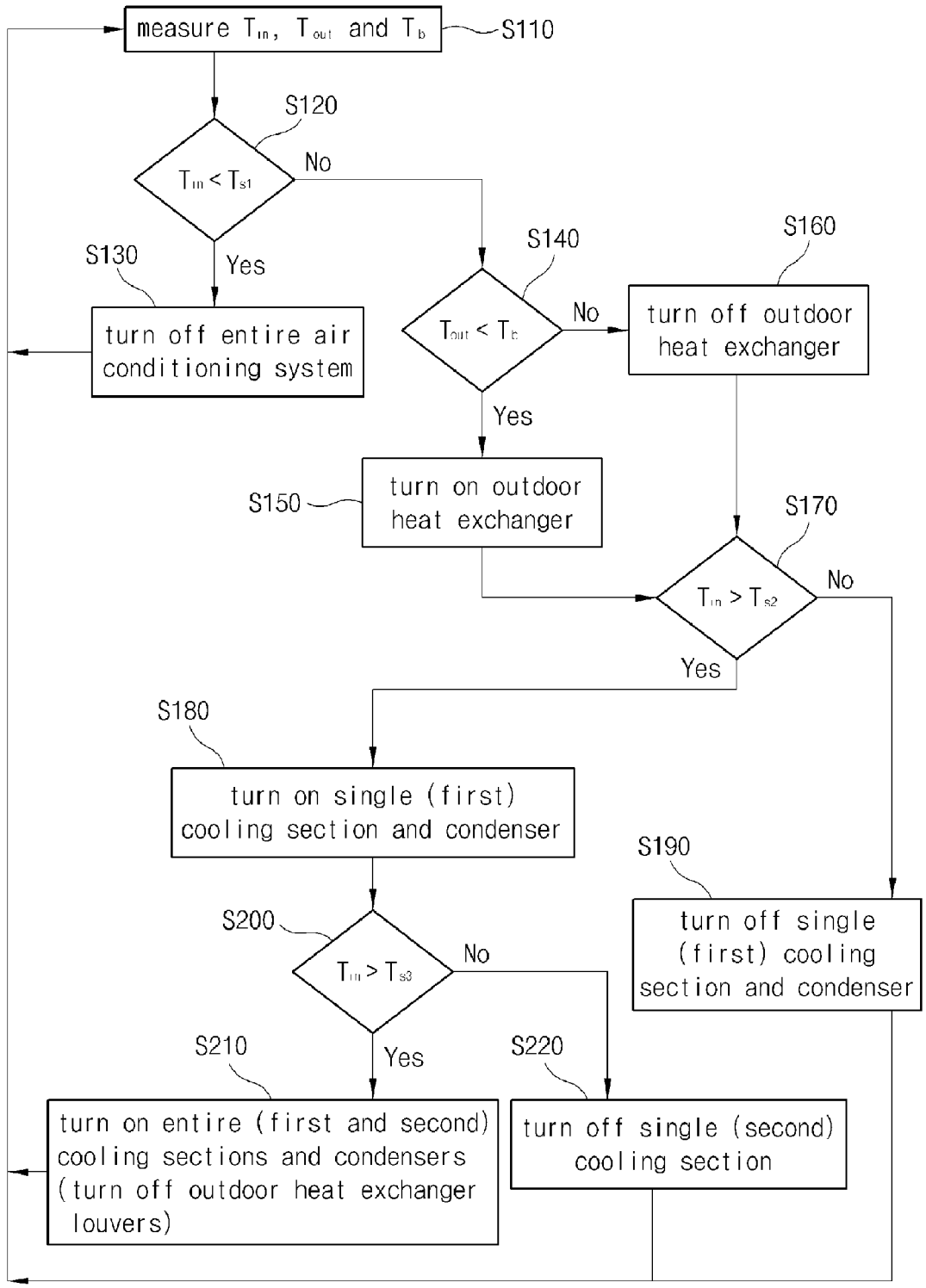
FIG. 4 is a flow chart illustrating a method for controlling an air conditioning system for communication equipment in accordance with another embodiment of the present invention.

FIG. 4 is a flow chart illustrating a method for controlling an air conditioning system for communication equipment in accordance with another embodiment of the present invention.

First, the indoor temperature $T_{in}$, the outdoor temperature $T_{out}$, and the brine temperature $T_b$ are sensed in an object, that is, in the base station 300, using the indoor temperature sensor 190, the outdoor temperature sensor 250, and the brine temperature sensor 260 (S110).—First step.

The indoor temperature $T_{in}$ sensed in this way is compared with a first reference temperature $T_{s1}$ (S120), and when the indoor temperature $T_{in}$ is lower than the first reference temperature $T_{s1}$, the operation of the entire air conditioning system is interrupted (all of the louvers 270 and 270' are closed) (S130).—Second step.

Then, by comparing the outdoor temperature $T_{out}$ with the brine temperature $T_b$, when the outdoor temperature $T_{out}$ is lower than the brine temperature $T_b$, the outdoor heat exchangers 220 are actuated (the louvers 270' for the outdoor heat exchangers 220 are opened) (S150), and when the outdoor temperature $T_{out}$ is equal to or higher than the brine temperature $T_b$, the operation of the outdoor heat exchangers 220 is interrupted (the louvers 270' for the outdoor heat exchangers 220 are closed) (S160).—Third step.

The third step is included to ensure that the operation of the outdoor heat exchangers 220 is interrupted in the hot summertime, in which the outdoor temperature $T_{out}$ is higher than the brine temperature $T_b$, and the outdoor heat exchangers 220 are actuated to use cool outdoor air in spring, early summer, fall and winter, in which the outdoor temperature $T_{out}$ is lower than the brine temperature $T_b$.

Next, by comparing the indoor temperature $T_{in}$ with a second reference temperature $T_{s2}$ (for example, 26.5° C.) (S170), when the indoor temperature $T_{in}$ is higher than the second reference temperature $T_{s2}$, the first cooling section (the expansion valve 110, the brine cooler 120 and the compressor 130) and the condensers 230 are actuated (the louvers 270 for the condensers 230 are opened) (S180), and when the indoor temperature $T_{in}$ is equal to or lower than the second reference temperature $T_{s2}$, the operation of the first cooling section (the expansion valve 110, the brine cooler 120 and the compressor 130) and the condensers 230 is interrupted (the louvers 270 for the condensers 230 are closed) (S190).—Fourth step.

Further, by comparing the indoor temperature $T_{in}$ with a third reference temperature $T_{s3}$ (for example, 27.5° C.) (S200), when the indoor temperature $T_{in}$ is higher than the third reference temperature $T_{s3}$, the entire cooling group, including the first and second cooling sections (the expansion valves 110 and 110' the brine coolers 120 and 120' and the compressors 130 and 130') and the condensers 230 are actuated (S210), and when the indoor temperature $T_{in}$ is equal to or lower than the third reference temperature T the operation of the second cooling section (the expansion valve 110', the brine cooler 120' and the compressor 130') is interrupted (S220).—Fifth step.

If the operation of the second cooling section (the expansion valve 110', the brine cooler 120' and the compressor 130') is interrupted, the heat exchange tubes 231 of the condensers 230, which are connected to the second cooling section, do not work.

The fourth and fifth steps are included to ensure that, when the communication equipment 180 is not sufficiently cooled by the operation of the outdoor heat exchangers 220, the first cooling section (the expansion valve 110, the brine cooler 120 and the compressor 130) can supplementarily operate, and when the communication equipment 180 is not sufficiently cooled even by the operation of the outdoor heat exchangers 220 and the first cooling section (the expansion valve 110, the brine cooler 120 and the compressor 130), the remaining second cooling section (the expansion valve 110' the brine cooler 120' and the compressor 130') can supplementarily operate, so that the heat exchange efficiency of the entire air conditioning system can be continuously maintained at a constant level.

In the case of operating the entire cooling group (the expansion valves 110 and 110' the brine coolers 120 and 120' and the compressors 130 and 130') connected to the indoor heat exchanger 140 and the condensers 230 (while opening the louvers 270 for the condensers 230), even when the outdoor temperature $T_{out}$ is lower than the brine temperature $T_b$, and therefore the outdoor heat exchangers 220 are actuated, the operation of the louvers 270' for the outdoor heat exchangers 220 is interrupted so that the louvers 270' for the outdoor heat exchangers 220 remain closed.

This is to prevent the phenomenon where, when operating the entire cooling group (the expansion valves 110 and 110' the brine coolers 120 and 120' and the compressors 130 and 130') connected to the indoor heat exchanger 140 (while opening the louvers 270 for the condensers 230), if both the louvers 270 for the condensers 230 and the louvers 270' for the outdoor heat exchangers 220 are opened, the outdoor blowers 240 discharges air in all directions, whereby the efficiency of the condensers 230 is deteriorated and noise generation is increased.

The indoor heat exchanger 140 and the indoor blowers 150 are simultaneously turned on and off when the power supply to the entire air conditioning system for supplying cooling air toward the communication equipment 180 is switched.

The first through third reference temperatures $T_{s1}$, $T_{s2}$, and $T_{s3}$ are set, for example, to 25° C., 26.5° C. and 27.5° C., respectively, and can be variously changed depending upon the kind of communication equipment 180 disposed in the base station 300.

After the respective steps S130, S190, S210, S220, the program can return to step S110 depending upon the indoor temperature $T_{in}$ to repeat the preceding steps, as a result of which it is possible to conform in real time to the indoor temperature $T_{in}$ which changes depending upon the operations of the outdoor heat exchangers, the first and second cooling sections (the expansion valves 110 and 110' the brine coolers 120 and 120' and the compressors 130 and 130') and the condensers 230.

Figure 5:
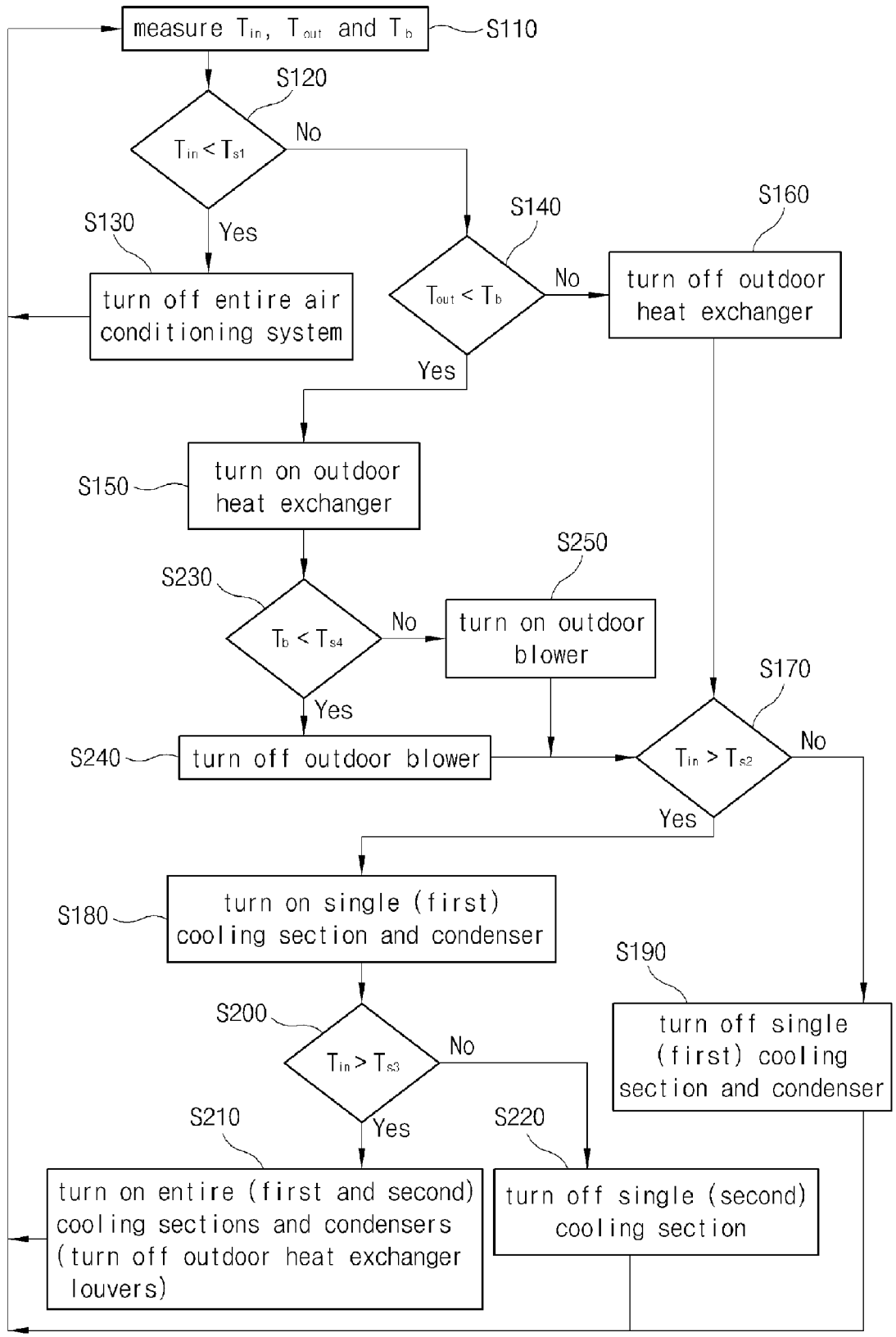
FIGS. 5 and 6 are flow charts each illustrating a method for controlling an air conditioning system for communication equipment in accordance with another embodiment of the present invention.

FIG. 5 is a flow chart further concretely illustrating the method for controlling an air conditioning system for communication equipment in accordance with another embodiment of the present invention, shown in FIG. 4.

In the third step, by comparing the outdoor temperature $T_{out}$ with the brine temperature $T_b$ (S140), when the outdoor temperature $T_{out}$ is lower than the brine temperature $T_b$, the outdoor heat exchangers 220 are actuated (S150). Thereafter, by comparing the brine temperature $T_b$ with a fourth reference temperature $T_{s4}$ (for example, set in the range of 2~7° C.) (S230), when the brine temperature $T_b$ is lower than the fourth reference temperature $T_{s4}$, the operation of the outdoor blowers 240 is interrupted (S240), and when the brine temperature $T_b$ is higher than the fourth reference temperature $T_{s4}$, the outdoor blowers 240 are actuated (S250).—Third-first step.

In the third-first step, in the case where the brine temperature $T_b$ is lower than the fourth reference temperature $T_{s4}$, the operation of the outdoor blowers 240 is interrupted without exception (S240) to prevent the brine from being abruptly cooled by the excessively low outdoor temperature in wintertime and the brine pipe 170 from consequently rupturing.

Figure 6:
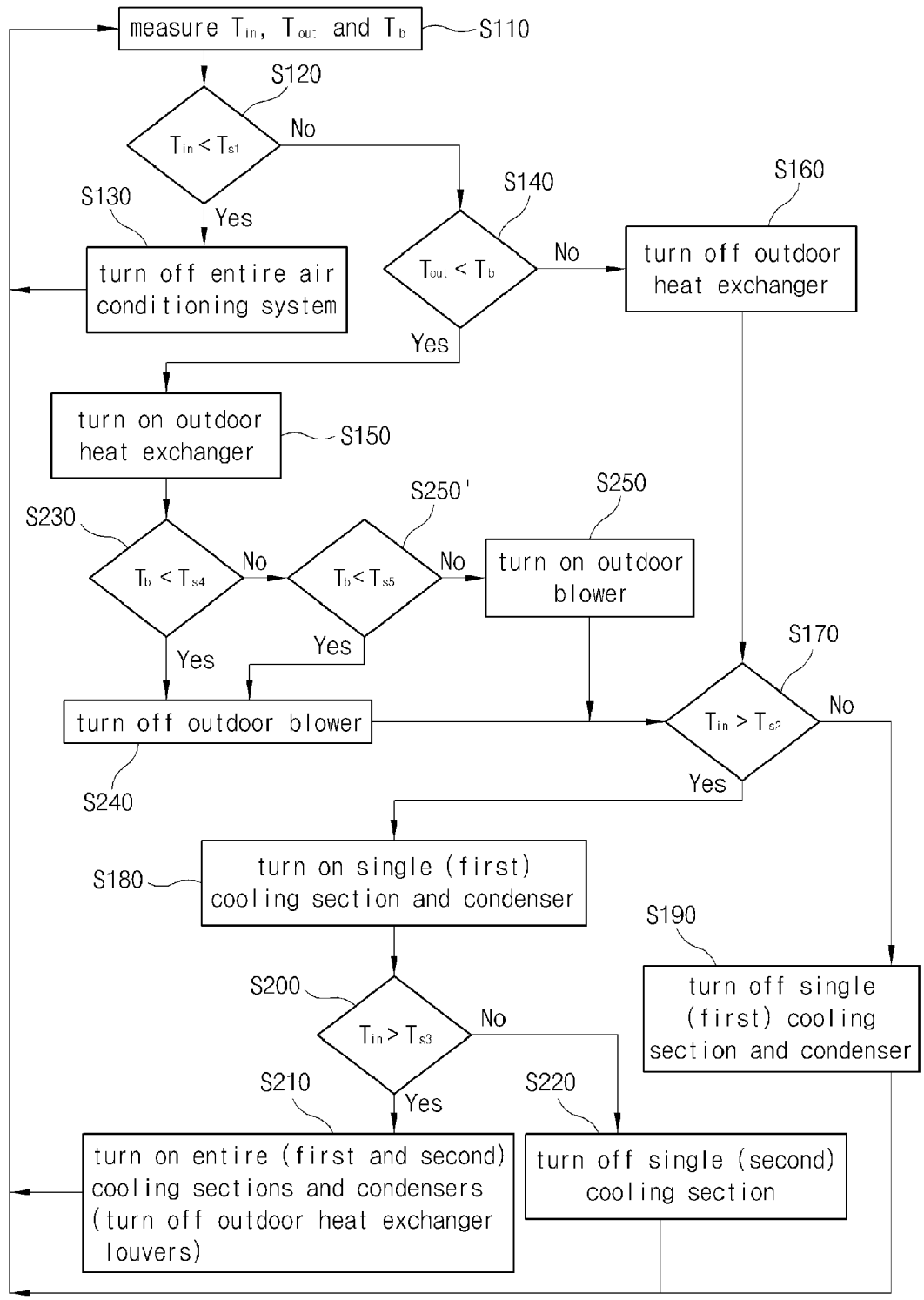

More preferably, as shown in FIG. 6, in the third-first step, by comparing the brine temperature $T_b$ with a fifth reference temperature $T_{s5}$ (for example, set in the range of 10~15° C.) when the brine temperature $T_b$ is equal to or higher than the fourth reference temperature $T_{s4}$, when the brine temperature $T_b$ is lower than the fifth reference temperature $T_{s5}$, the operation of the outdoor blowers 240 is interrupted, and when the brine temperature $T_b$ is equal to or higher than the fifth reference temperature $T_{s5}$, the outdoor blowers 240 are actuated.—Third-second step.

The third-second step functions to prevent the phenomenon where, when the outdoor blowers 240 are frequently turned on and off, overload, vibration and various noise are generated in the outdoor blowers 240.

Figure 7:
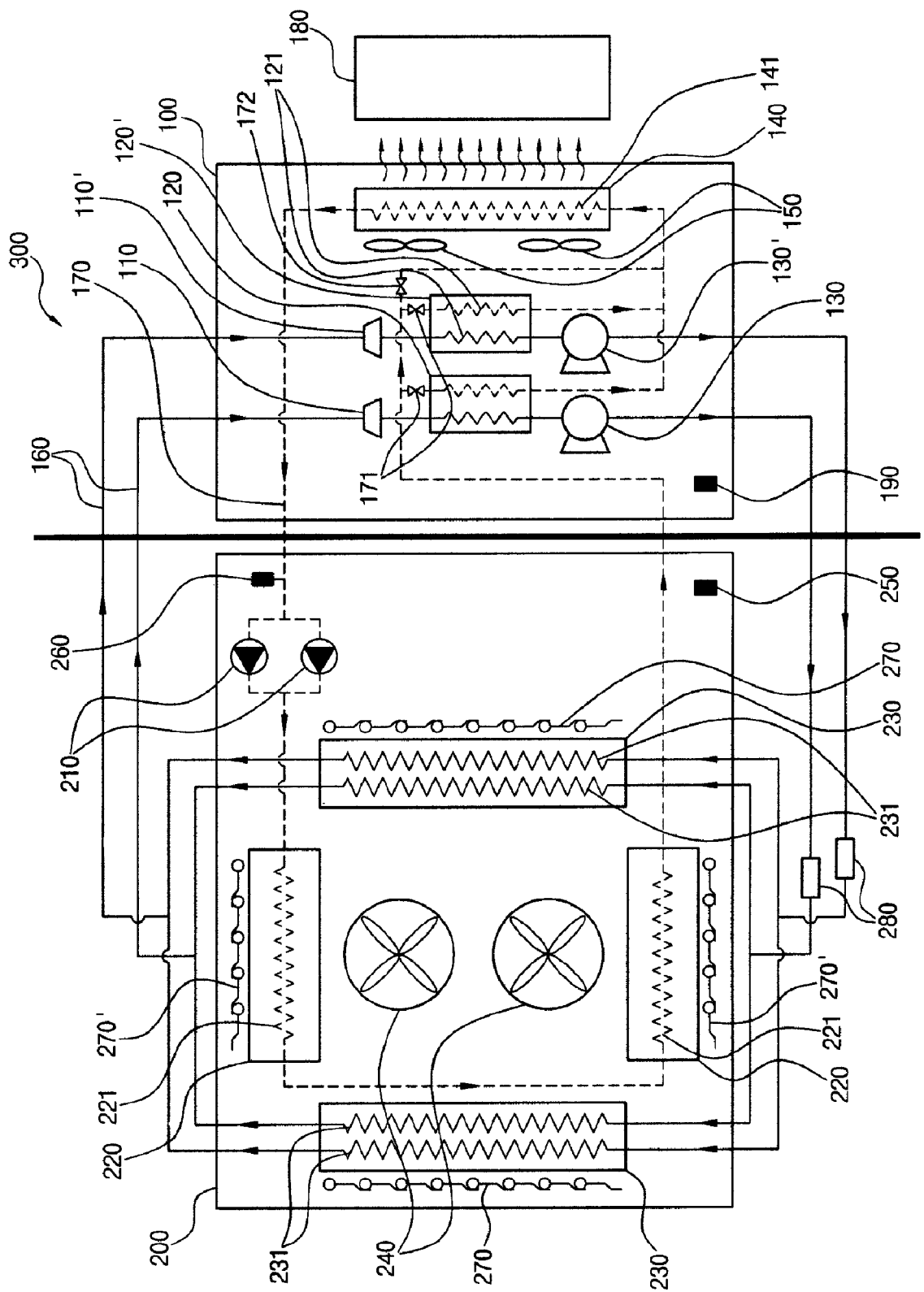
FIGS. 7 through 12 are schematic structural views illustrating air conditioning systems for communication equipment in accordance with other embodiments of the present invention.
Figure 9:
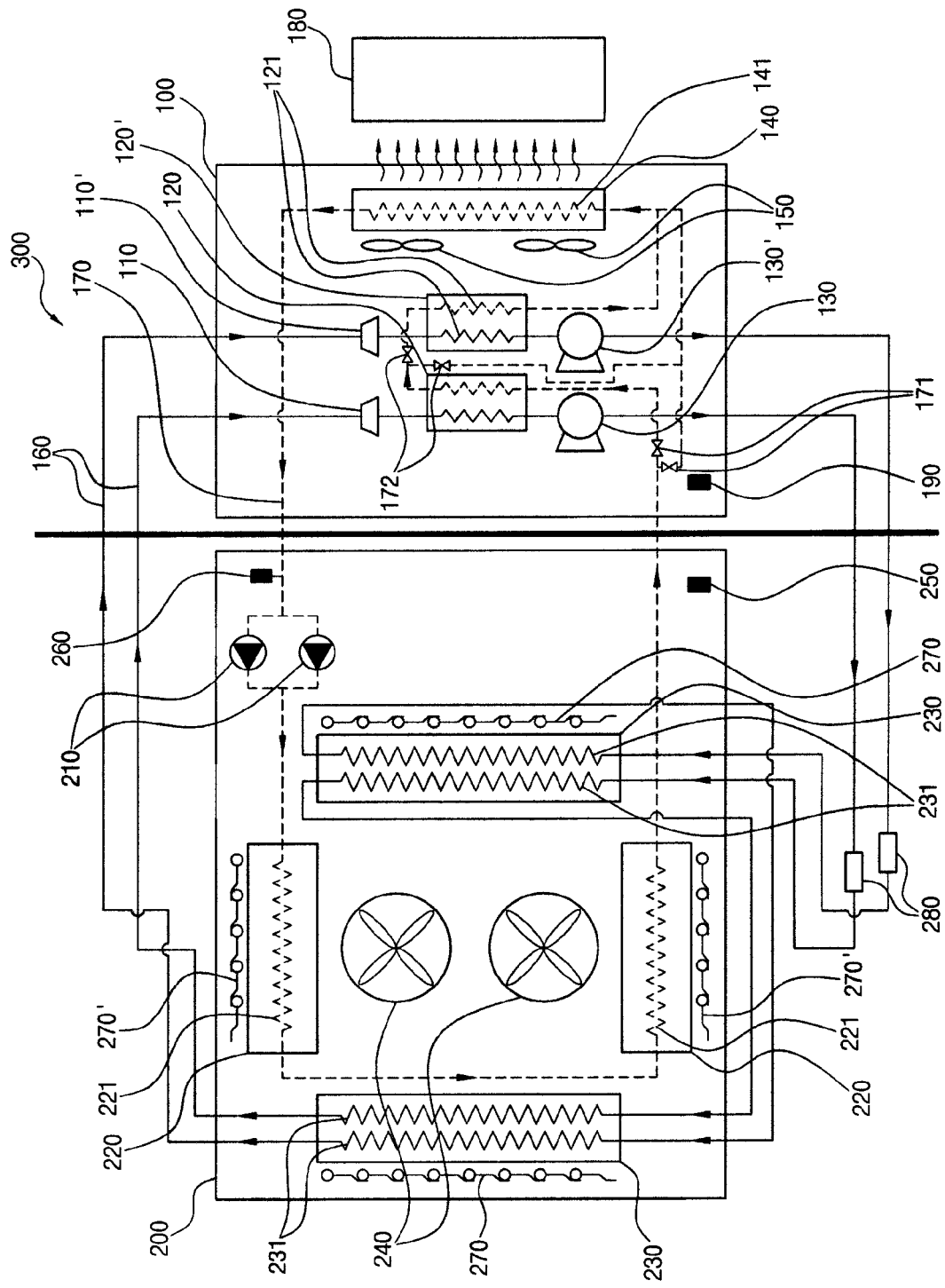
Figure 11:
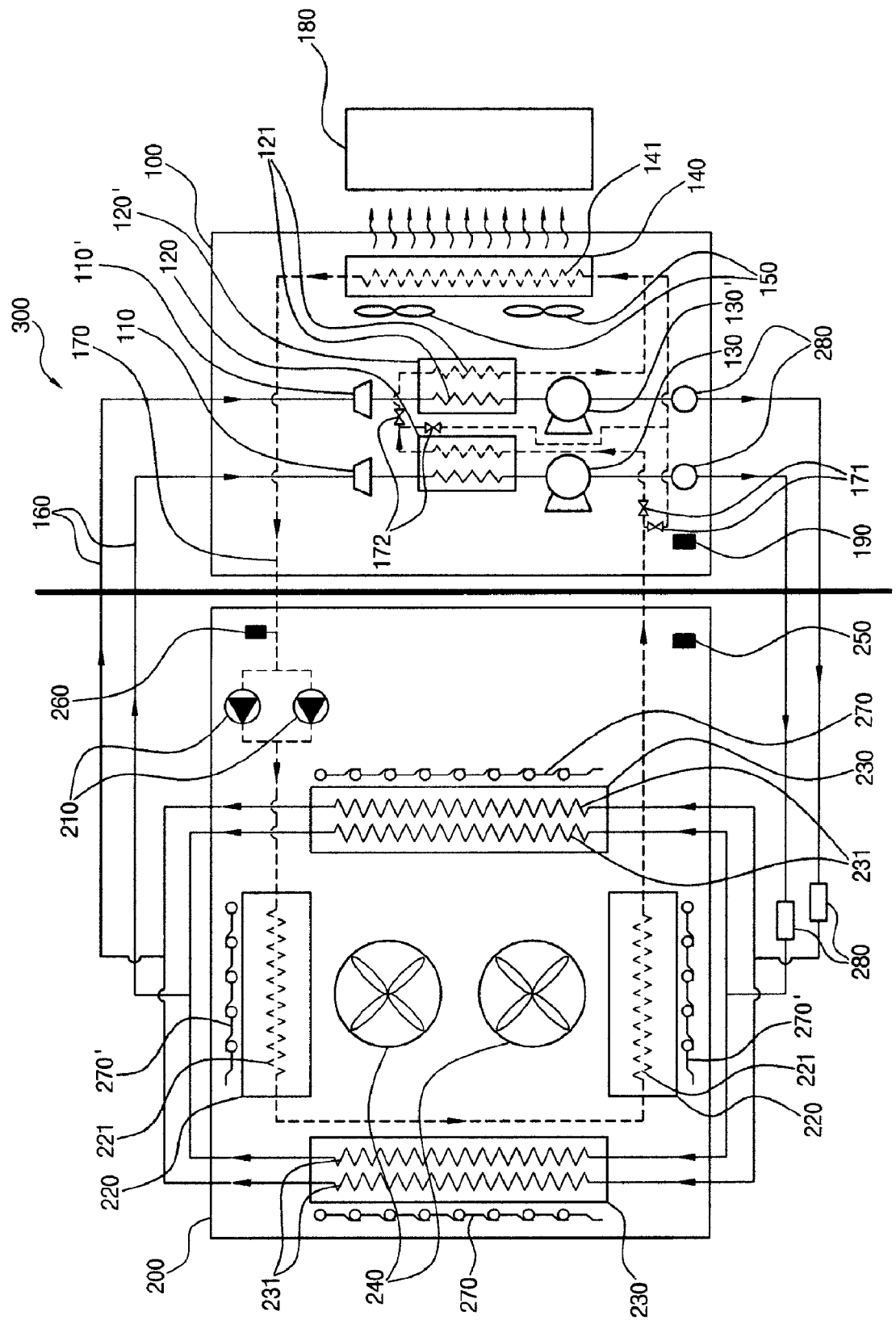

In the present invention, if the operation of the cooling group is discontinued, as shown in FIGS. 7, 9 and 11, it is preferred that the brine pipe 170 be separately branched from the portions of the brine pipe 170 which are respectively introduced into the brine coolers 120 and 120' or connect the two brine coolers 120 and 120', and that separate flow control valves (individual on/off valves or a three-way valve) 171 and 172 be installed, so that the brine can flow while detouring around the non-operating brine coolers 120 and 120'.

Figure 8:
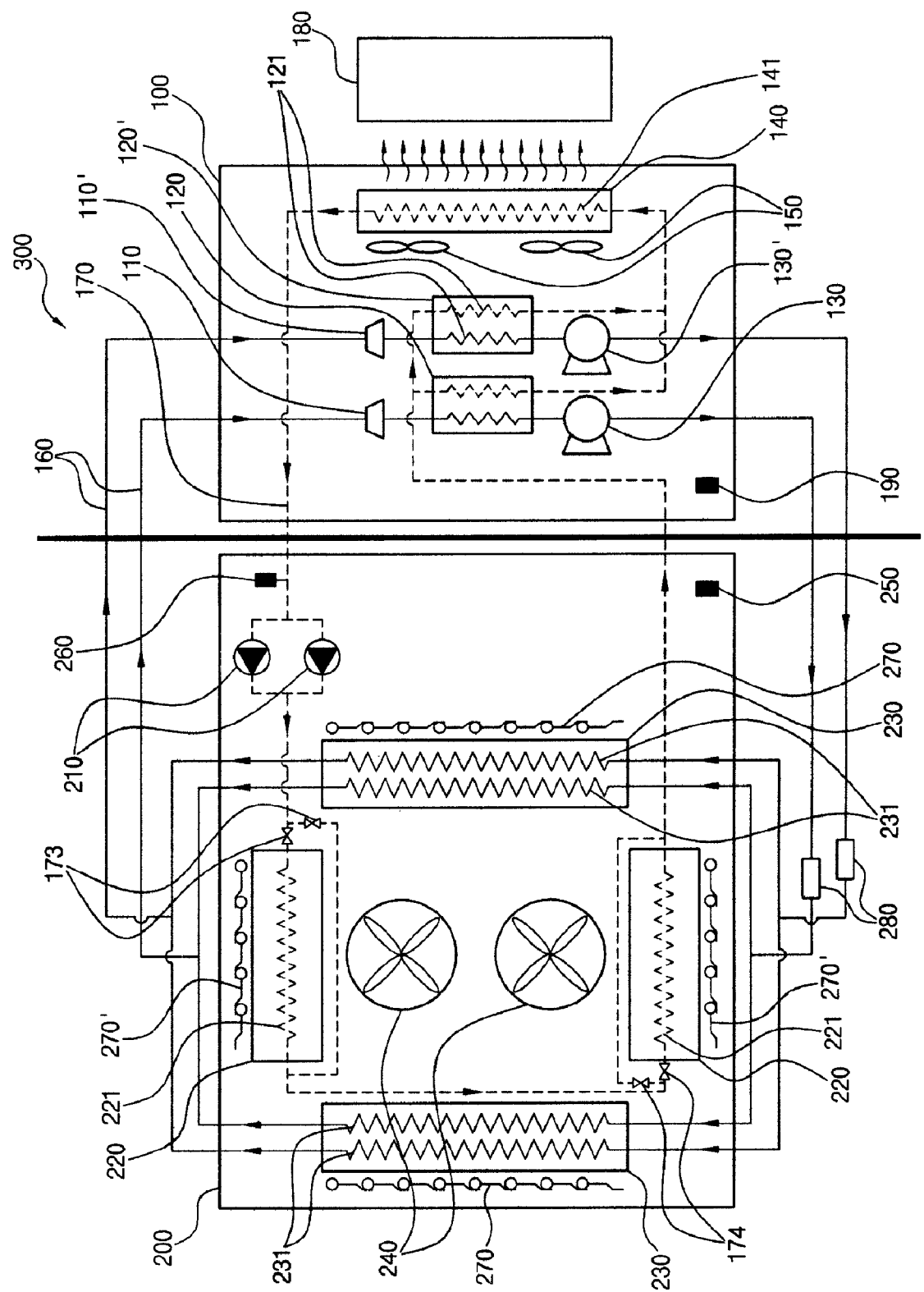
Figure 10:
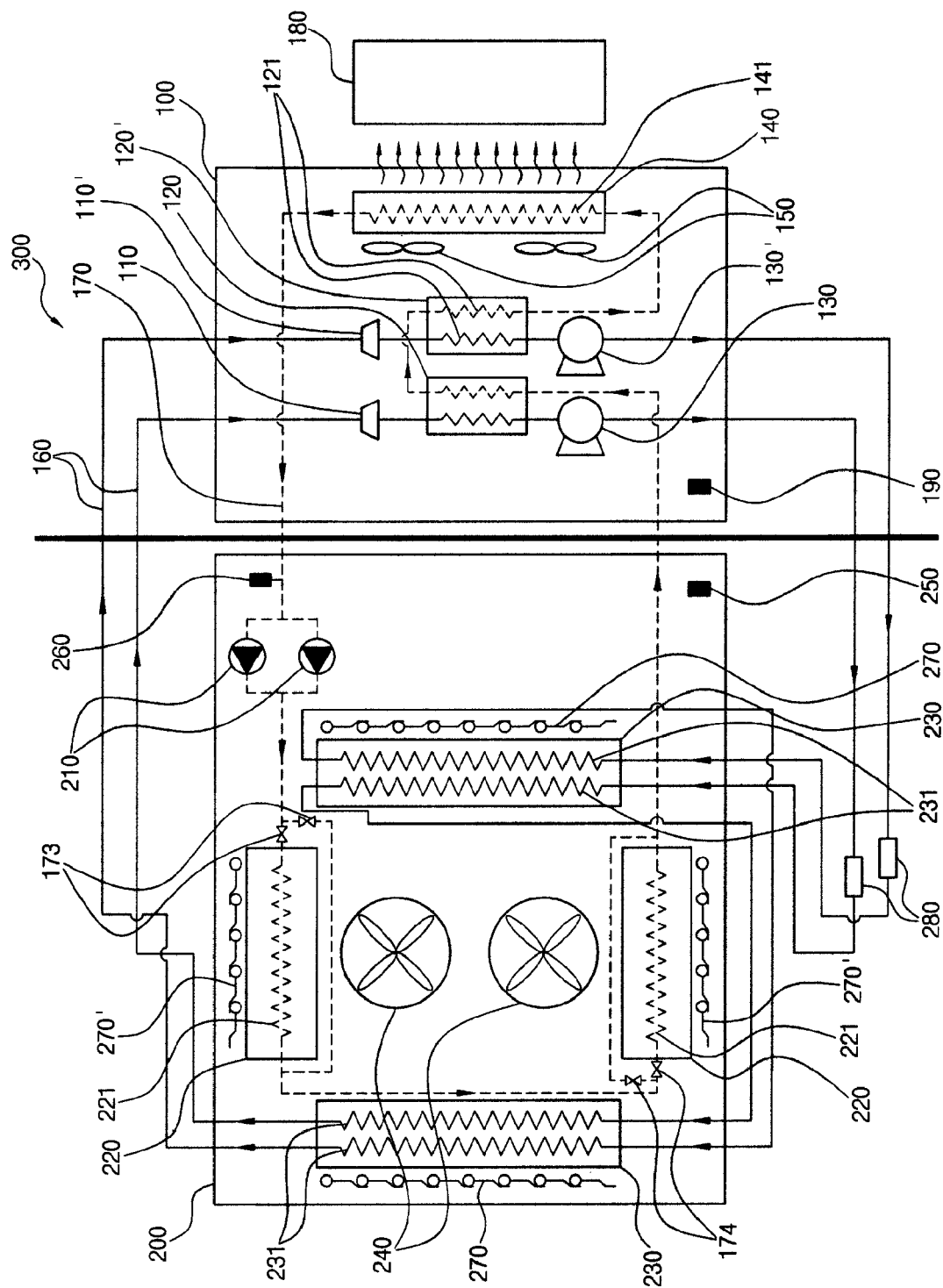
Figure 12:
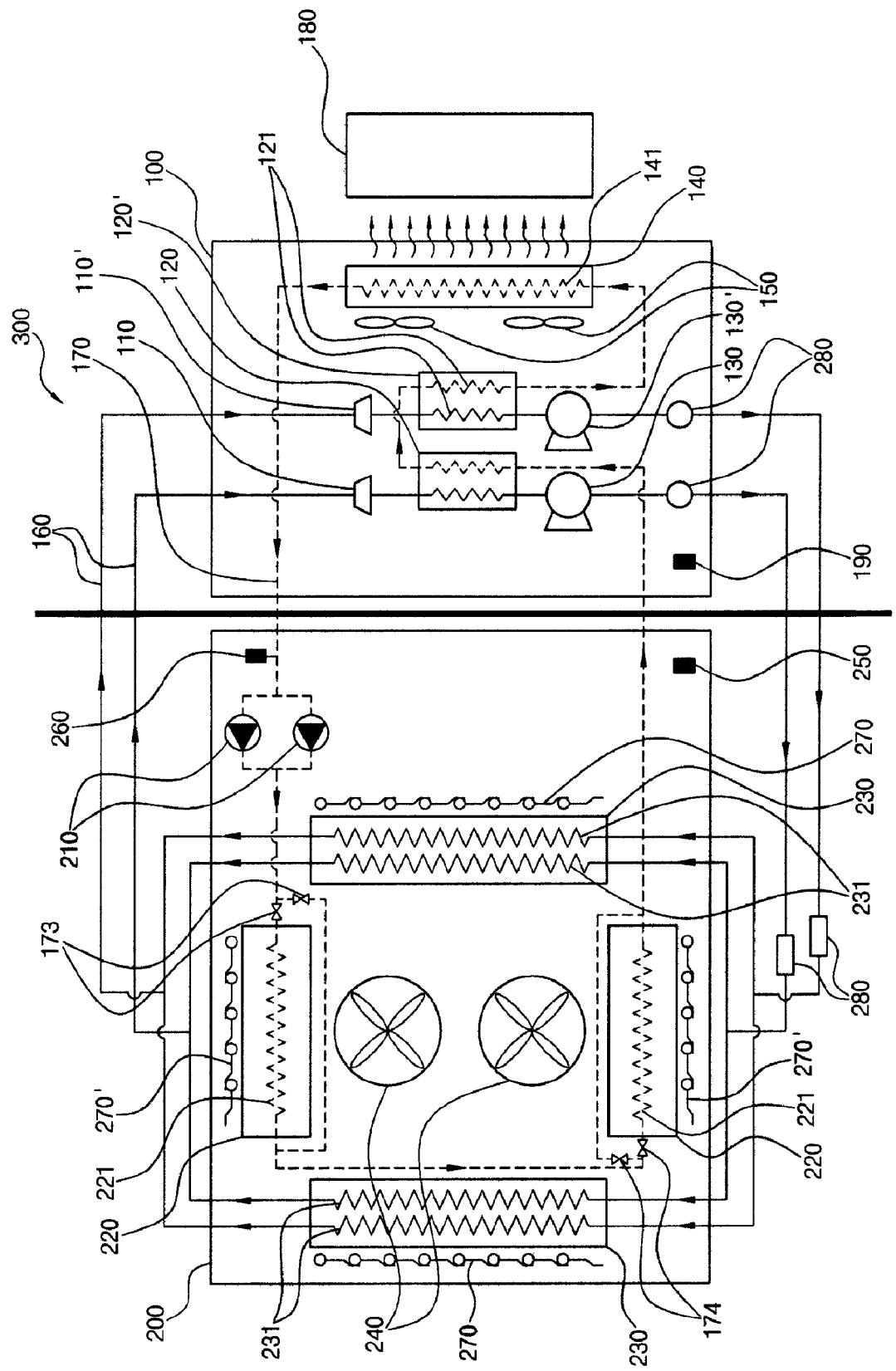

Further, if the operation of the outdoor heat exchangers 220 is turned off, as shown in FIGS. 8, 10 and 12, it is preferred that the brine pipe 170 be separately branched from the portions of the brine pipe 170 which are introduced into respective outdoor heat exchangers 220 or connect the two outdoor heat exchangers 220, and separate flow control valves (individual on/off valves or a three-way valve) 173 and 174 be installed, so that the brine can flow while detouring around the non-operating outdoor heat exchangers 220.

Hereafter, the operational effects of the air conditioning system for communication equipment and the controlling method thereof according to the present invention, constructed as mentioned above, will be described.

First, in the air conditioning system according to the first through third embodiments of the present invention, the brine coolers 120 and 120' are included in the indoor module 100, the outdoor heat exchangers 220 facing each other and the condensers 230 facing each other are located to define a hollow quadrangular shape, and the outdoor blowers 240 are positioned inside the hollow quadrangular shape. Consequently, as space utilization efficiency is improved, it is possible to miniaturize the outdoor module 200, and as the operational efficiency of the outdoor blowers 240 is improved, noise generation is suppressed.

Further, in the first and third embodiments, since the condensers 230 are connected in parallel to the refrigerant pipes 160 and each condenser 230 has the pair of tubes 231, even when one condenser 230 or one tube 231 does not work, the stable operation of the other condenser 230 or the other tube 231 is ensured.

Meanwhile, in the second embodiment, since the condensers 230 are connected in series to the refrigerant pipes 160 and each condenser 230 has the pair of tubes 231, the heat exchange efficiency of the refrigerant is further improved.

Next, in the method for controlling an air conditioning system, depending upon the indoor temperature $T_{in}$, the outdoor temperature $T_{out}$ and the brine temperature $T_b$, which are sensed by the indoor temperature sensor 190, the outdoor temperature sensor 250 and the brine temperature sensor 260, as shown in FIGS. 4 through 6, the operation of the outdoor heat exchangers 220, the first and second cooling sections (the expansion valves 110 and 110' the brine coolers 120 and 120' and the compressors 130 and 130') and the condensers 230 is determined.

Thus, the brine exchanges heat with the natural cool air through the outdoor heat exchangers 220 to be cooled to a desired temperature or is bypassed toward the indoor module 100 without exchanging heat in the outdoor heat exchangers 220.

Specifically, in the electromotive louvers 270 and 270' which are installed outside the outdoor heat exchangers 220 and the condensers 230, all of the louvers 270' for the outdoor heat exchangers 220 are closed when the entire cooling group (the expansion valves 110 and 110' the brine coolers 120 and 120' and the compressors 130 and 130') is operated (while the louvers 270 for the condensers 230 are opened). Due to this fact, it is possible to prevent the outdoor blowers 240 from discharging air in all directions to thus deteriorate the efficiency of the condensers 230 and generate noise.

Moreover, in addition to the fact that the miniaturization of the outdoor module 200 and suppression of noise generation are enabled in the present invention, in an effort to cool the brine having absorbed the heat from the inside space of the base station 300 below a desired temperature, the cooling group (the expansion valves 110 and 110', the brine coolers 120 and 120' and the compressors 130 and 130'), the condensers 230, and the outdoor heat exchangers 220 are selectively operated depending upon the indoor and outdoor temperatures and the brine temperature. Thus, the natural cool air can be effectively employed, and the waste of refrigerant and electric power can be prevented through selective use of the cooling group and other component elements.

Furthermore, in the present invention, the double brine circulation structures are adopted, in which the pair of circulation pumps 210, the cooling group (the expansion valves 110 and 110' the brine coolers 120 and 120' and the compressors 130 and 130') and the condensers 230 are respectively installed in series or in parallel, and the brine pipe 170 is connected in parallel or in series to the brine coolers 120 and 120'. As a result, cooling efficiency is improved, and the cooled state of the communication equipment can be reliably maintained.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An air conditioning system for communication equipment, comprising:
    an indoor module placed inside a base station in which communication equipment is installed, the indoor module having expansion valves installed on refrigerant pipes, brine coolers each having a pair of heat exchange tubes to which the refrigerant pipe extending from each expansion valve and a separate brine pipe are respectively connected, compressors for compressing refrigerant having passed through the brine coolers, an indoor heat exchanger having a heat exchange tube to which the brine pipe extending from the brine coolers is connected, and at least one indoor blower located adjacent to the indoor heat exchanger; and
    an outdoor module placed outside the base station, the outdoor module having a pair of circulation pumps connected in parallel to the brine pipe extending from the indoor heat exchanger, a pair of outdoor heat exchangers connected in series with each other while facing each other and each having a heat exchange tube to which the brine pipe extending from the circulation pumps is fluidly connected, a pair of condensers facing each other and having tubes to which the refrigerant pipes extending from the compressors of the indoor module are connected in parallel, and at least one outdoor blower located between the pair of outdoor heat exchangers.

2. The air conditioning system as set forth in claim 1, wherein the expansion valves, the brine coolers and the compressors of the indoor module constitute a single cooling group which is divided into first and second cooling sections, the first and second cooling sections are respectively connected to the refrigerant pipes which are separated from each other, and two brine coolers are connected in parallel to one brine pipe.

3. The air conditioning system as set forth in claim 1, wherein the expansion valves, the brine coolers and the compressors of the indoor module constitute a single cooling group which is divided into first and second cooling sections, the first and second cooling sections are respectively connected to the refrigerant pipes which are separated from each other, and two brine coolers are connected in series to one brine pipe.

4. An air conditioning system for communication equipment, comprising:
    an indoor module placed inside a base station in which communication equipment is installed, the indoor module having expansion valves installed on refrigerant pipes, brine coolers each having a pair of heat exchange tubes to which the refrigerant pipe extending from each expansion valve and a separate brine pipe are respectively connected, compressors for compressing refrigerant having passed through the brine coolers, an indoor heat exchanger having a heat exchange tube to which the brine pipe extending from the brine coolers is connected, and at least one indoor blower located adjacent to the indoor heat exchanger; and
    an outdoor module placed outside the base station, the outdoor module having a pair of circulation pumps connected in parallel to the brine pipe extending from the indoor heat exchanger, a pair of outdoor heat exchangers connected in series with each other while facing each other and each having a heat exchange tube to which the brine pipe extending from the circulation pumps is fluidly connected, a pair of condensers facing each other and having tubes to which the refrigerant pipes extending from the compressors of the indoor module are connected in series, and at least one outdoor blower located between the pair of outdoor heat exchangers.

5. The air conditioning system as set forth in claim 4, wherein the expansion valves, the brine coolers and the compressors of the indoor module constitute a single cooling group which is divided into first and second cooling sections, the first and second cooling sections are respectively connected to the refrigerant pipes which are separated from each other, and two brine coolers are connected in series to one brine pipe.

6. The air conditioning system as set forth in claim 5, wherein, in the outdoor module, each of the pair of condensers has a pair of heat exchange tubes to which the refrigerant pipes extending from respective cooling sections are connected.

7. The air conditioning system as set forth in claim 6, wherein an indoor temperature sensor is installed inside the base station, an outdoor temperature sensor is installed outside the base station, and a brine temperature sensor is installed on a portion of the brine pipe which is introduced into the outdoor module after passing through the indoor heat exchanger.

8. The air conditioning system as set forth in claim 7, wherein electromotive louvers are installed outside and adjacent to the outdoor heat exchangers and the condensers.

9. A method for controlling the air conditioning system according to claim 8, comprising:
    a first step of sensing indoor and outdoor temperatures of the base station and a brine temperature using the indoor and outdoor temperature sensors and the brine temperature sensor;
    a second step of comparing the indoor temperature with a first reference temperature and interrupting operation of the entire air conditioning system when the indoor temperature is lower than the first reference temperature;
    a third step of comparing the outdoor temperature and the brine temperature, actuating the outdoor heat exchangers when the outdoor temperature is lower than the brine temperature, and interrupting operation of the outdoor heat exchangers when the outdoor temperature is equal to or higher than the brine temperature;

a fourth step of actuating the first cooling section and the condensers when the indoor temperature is higher than a second reference temperature, and interrupting operation of the first cooling section and the condensers when the indoor temperature is equal to or lower than the second reference temperature; and a fifth step of actuating the first and second cooling sections and the condensers when the indoor temperature is higher than a third reference temperature, and interrupting operation of the second cooling section when the indoor temperature is equal to or lower than the third reference temperature.

10. The method as set forth in claim 9, wherein the electromotive louvers are controlled to be opened and closed depending upon operation of the outdoor heat exchangers and the condensers such that, when the entire cooling group and the condensers operate, the louvers installed adjacent to the outdoor heat exchangers are closed.

11. The method as set forth in claim 10, wherein the third step further comprises:
a third-first step of interrupting operation of the outdoor blower when the brine temperature is lower than a fourth reference temperature, and actuating the outdoor blower when the brine temperature is equal to or higher than the fourth reference temperature.

12. The method as set forth in claim 11, wherein the third-first step further comprises:
a third-second step of interrupting operation of the outdoor blower when the brine temperature is higher than the fourth reference temperature and is lower than a fifth reference temperature, and actuating the outdoor blower when the brine temperature is equal to or higher than the fifth reference temperature.

13. The air conditioning system as set forth in claim 3, wherein, in the outdoor module, each of the pair of condensers has a pair of heat exchange tubes to which the refrigerant pipes extending from respective cooling sections are connected.

14. The air conditioning system as set forth in claim 2, wherein, in the outdoor module, each of the pair of condensers has a pair of heat exchange tubes to which the refrigerant pipes extending from respective cooling sections are connected.

15. The air conditioning system as set forth in claim 14, wherein an indoor temperature sensor is installed inside the base station, an outdoor temperature sensor is installed outside the base station, and a brine temperature sensor is installed on a portion of the brine pipe which is introduced into the outdoor module after passing through the indoor heat exchanger.

16. The air conditioning system as set forth in claim 13, wherein an indoor temperature sensor is installed inside the base station, an outdoor temperature sensor is installed outside the base station, and a brine temperature sensor is installed on a portion of the brine pipe which is introduced into the outdoor module after passing through the indoor heat exchanger.

17. The air conditioning system as set forth in claim 16, wherein electromotive louvers are installed outside and adjacent to the outdoor heat exchangers and the condensers.

18. The air conditioning system as set forth in claim 15, wherein electromotive louvers are installed outside and adjacent to the outdoor heat exchangers and the condensers.

19. A method for controlling the air conditioning system according to claim 18, comprising:
a first step of sensing indoor and outdoor temperatures of the base station and a brine temperature using the indoor and outdoor temperature sensors and the brine temperature sensor;
a second step of comparing the indoor temperature with a first reference temperature and interrupting operation of the entire air conditioning system when the indoor temperature is lower than the first reference temperature;
a third step of comparing the outdoor temperature and the brine temperature, actuating the outdoor heat exchangers when the outdoor temperature is lower than the brine temperature, and interrupting operation of the outdoor heat exchangers when the outdoor temperature is equal to or higher than the brine temperature;
a fourth step of actuating the first cooling section and the condensers when the indoor temperature is higher than a second reference temperature, and interrupting operation of the first cooling section and the condensers when the indoor temperature is equal to or lower than the second reference temperature; and
a fifth step of actuating the first and second cooling sections and the condensers when the indoor temperature is higher than a third reference temperature, and interrupting operation of the second cooling section when the indoor temperature is equal to or lower than the third reference temperature.

20. A method for controlling the air conditioning system according to claim 17, comprising:
a first step of sensing indoor and outdoor temperatures of the base station and a brine temperature using the indoor and outdoor temperature sensors and the brine temperature sensor;
a second step of comparing the indoor temperature with a first reference temperature and interrupting operation of the entire air conditioning system when the indoor temperature is lower than the first reference temperature;
a third step of comparing the outdoor temperature and the brine temperature, actuating the outdoor heat exchangers when the outdoor temperature is lower than the brine temperature, and interrupting operation of the outdoor heat exchangers when the outdoor temperature is equal to or higher than the brine temperature;
a fourth step of actuating the first cooling section and the condensers when the indoor temperature is higher than a second reference temperature, and interrupting operation of the first cooling section and the condensers when the indoor temperature is equal to or lower than the second reference temperature; and
a fifth step of actuating the first and second cooling sections and the condensers when the indoor temperature is higher than a third reference temperature, and interrupting operation of the second cooling section when the indoor temperature is equal to or lower than the third reference temperature.

* * * * *